(12) United States Patent
Besser et al.

(10) Patent No.: US 7,910,996 B2
(45) Date of Patent: Mar. 22, 2011

(54) SEMICONDUCTOR DEVICE AND METHOD OF MANUFACTURING A SEMICONDUCTOR DEVICE

(75) Inventors: Paul R. Besser, Sunnyvale, CA (US); Scott D. Luning, Poughkeepsie, NY (US)

(73) Assignee: Globalfoundries Inc.

( * ) Notice: Subject to any disclaimer, the term of this patent is extended or adjusted under 35 U.S.C. 154(b) by 0 days.

(21) Appl. No.: 12/496,133

(22) Filed: Jul. 1, 2009

(65) Prior Publication Data

US 2009/0267152 A1   Oct. 29, 2009

Related U.S. Application Data

(62) Division of application No. 11/231,647, filed on Sep. 21, 2005, now Pat. No. 7,572,705.

(51) Int. Cl.
*H01L 29/12* (2006.01)
(52) U.S. Cl. .............. 257/347; 257/510; 257/E29.121
(58) Field of Classification Search .......... 257/368, 257/382, 384, 347, 510, E27.06, E29.121, 257/E29.255
See application file for complete search history.

(56) References Cited

U.S. PATENT DOCUMENTS

| | | |
|---|---|---|
| 4,606,866 A | 8/1986 | McGlothlin et al. |
| 4,868,617 A | 9/1989 | Chiao et al. |
| 4,877,757 A | 10/1989 | York et al. |
| 4,933,295 A | 6/1990 | Feist |
| 5,091,763 A | 2/1992 | Sanchez |
| 5,180,464 A | 1/1993 | Tatsumi et al. |
| 5,183,770 A | 2/1993 | Ayukawa et al. |
| 5,298,454 A | 3/1994 | D'Asaro et al. |
| 5,319,232 A | 6/1994 | Pfiester |
| 5,387,309 A | 2/1995 | Bobel et al. |
| 5,556,462 A | 9/1996 | Celii et al. |
| 5,646,073 A | 7/1997 | Grider et al. |
| 5,670,018 A | 9/1997 | Eckstein et al. |
| 5,677,214 A | 10/1997 | Hsu |
| 5,696,012 A | 12/1997 | Son |
| 5,710,450 A | 1/1998 | Chau et al. |
| 5,773,328 A | 6/1998 | Blanchard |
| 5,854,136 A | 12/1998 | Huang et al. |
| 5,902,125 A | 5/1999 | Wu |
| 5,926,701 A | 7/1999 | Li |
| 5,949,126 A | 9/1999 | Dawson et al. |
| 5,953,609 A | 9/1999 | Koyama et al. |
| 5,956,590 A | 9/1999 | Hsieh et al. |
| 6,017,779 A | 1/2000 | Miyasaka |
| 6,024,794 A | 2/2000 | Tamamura et al. |

(Continued)

FOREIGN PATENT DOCUMENTS

JP     06326049 A    11/1994

OTHER PUBLICATIONS

Besser et al., "Silicides for the 65 nm Technology Node," MRS Symposium Proc. 766, 2003, pp. 1-11, USA.

(Continued)

*Primary Examiner* — Mary Wilczewski (57) ABSTRACT

A semiconductor device is disclosed having a conductive gate structure overlying a semiconductor layer having a major surface. An isolation material is recessed within a trench region below the major surface of the semiconductor layer. An epitaxial layer is formed overlying a portion of the major surface and on an active region forming a sidewall of the trench.

20 Claims, 3 Drawing Sheets

U.S. PATENT DOCUMENTS

| | | | |
|---|---|---|---|
| 6,074,939 | A | 6/2000 | Watanabe |
| 6,077,076 | A | 6/2000 | Comfort |
| 6,124,610 | A | 9/2000 | Cheek et al. |
| 6,133,093 | A | 10/2000 | Prinz et al. |
| 6,143,036 | A | 11/2000 | Comfort |
| 6,159,422 | A | 12/2000 | Graves et al. |
| 6,165,826 | A | 12/2000 | Chau et al. |
| 6,165,857 | A | 12/2000 | Yeh et al. |
| 6,165,906 | A | 12/2000 | Bandyopadhyay et al. |
| 6,187,645 | B1 | 2/2001 | Lin et al. |
| 6,190,981 | B1 | 2/2001 | Lin et al. |
| 6,214,049 | B1 | 4/2001 | Gayer et al. |
| 6,228,730 | B1 | 5/2001 | Chen et al. |
| 6,228,746 | B1 | 5/2001 | Ibok |
| 6,235,568 | B1 | 5/2001 | Murthy et al. |
| 6,245,684 | B1 | 6/2001 | Zhao et al. |
| 6,251,764 | B1 | 6/2001 | Pradeep et al. |
| 6,255,152 | B1 | 7/2001 | Chen |
| 6,271,572 | B1 | 8/2001 | Fujita |
| 6,277,700 | B1 | 8/2001 | Yu et al. |
| 6,277,736 | B1 | 8/2001 | Chen et al. |
| 6,284,662 | B1 | 9/2001 | Mikagi |
| 6,294,432 | B1 | 9/2001 | Lin et al. |
| 6,303,447 | B1 | 10/2001 | Chhagan et al. |
| 6,313,017 | B1 | 11/2001 | Varhue |
| 6,316,302 | B1 | 11/2001 | Cheek et al. |
| 6,335,251 | B2 | 1/2002 | Miyano et al. |
| 6,346,447 | B1 | 2/2002 | Rodder |
| 6,346,468 | B1 | 2/2002 | Pradeep et al. |
| 6,348,387 | B1 | 2/2002 | Yu |
| 6,380,043 | B1 | 4/2002 | Yu |
| 6,383,877 | B1 | 5/2002 | Ahn et al. |
| 6,387,765 | B2 | 5/2002 | Chhagan et al. |
| 6,403,434 | B1 | 6/2002 | Yu |
| 6,436,505 | B2 | 8/2002 | Kuroda et al. |
| 6,436,841 | B1 | 8/2002 | Tsai et al. |
| 6,440,851 | B1 | 8/2002 | Agnello et al. |
| 6,444,578 | B1 | 9/2002 | Cabral, Jr. et al. |
| 6,451,693 | B1 | 9/2002 | Woo et al. |
| 6,461,385 | B1 | 10/2002 | Gayer et al. |
| 6,472,283 | B1 | 10/2002 | Ishida et al. |
| 6,479,258 | B1 | 11/2002 | Short |
| 6,596,138 | B2 | 7/2003 | Shibasaki |
| 6,600,212 | B2 | 7/2003 | Takayanagi et al. |
| 6,649,489 | B1 | 11/2003 | Chang et al. |
| 6,673,637 | B2 | 1/2004 | Wack et al. |
| 6,677,233 | B2 | 1/2004 | Dubin |
| 6,679,946 | B1 | 1/2004 | Jackson et al. |
| 6,713,350 | B2 | 3/2004 | Rudeck |
| 6,726,767 | B1 | 4/2004 | Marrs et al. |
| 6,727,553 | B2 | 4/2004 | Kotani |
| 6,777,759 | B1 | 8/2004 | Chau et al. |
| 6,800,213 | B2 | 10/2004 | Ding et al. |
| 6,812,045 | B1 | 11/2004 | Nikoonahad et al. |
| 6,890,391 | B2 | 5/2005 | Aoki et al. |
| 6,908,822 | B2 | 6/2005 | Rendon et al. |
| 6,924,518 | B2 | 8/2005 | Iinuma et al. |
| 6,946,371 | B2 | 9/2005 | Langdo et al. |
| 6,979,622 | B1 | 12/2005 | Thean et al. |
| 7,008,835 | B2 | 3/2006 | Jin et al. |
| 7,014,788 | B1 | 3/2006 | Fujimura et al. |
| 7,018,891 | B2 | 3/2006 | Doris et al. |
| 7,037,793 | B2 | 5/2006 | Chien et al. |
| 7,037,795 | B1 * | 5/2006 | Barr et al. ............ 438/300 |
| 7,176,522 | B2 | 2/2007 | Cheng et al. |
| 7,183,662 | B2 | 2/2007 | Kim et al. |
| 7,190,036 | B2 | 3/2007 | Ko et al. |
| 7,193,276 | B2 * | 3/2007 | Lim et al. ............ 257/368 |
| 7,220,650 | B2 | 5/2007 | Kao et al. |
| 7,226,832 | B2 | 6/2007 | Yeo et al. |
| 7,235,848 | B2 | 6/2007 | Jeng |
| 7,241,700 | B1 | 7/2007 | En et al. |
| 7,314,804 | B2 | 1/2008 | Lindert et al. |
| 7,355,262 | B2 | 4/2008 | Ko et al. |
| 7,358,551 | B2 | 4/2008 | Chidambarrao et al. |
| 7,358,574 | B2 | 4/2008 | Choi |
| 7,465,620 | B2 * | 12/2008 | Ko et al. ............ 438/199 |
| 7,473,947 | B2 * | 1/2009 | Murthy et al. ............ 257/288 |
| 7,485,538 | B1 * | 2/2009 | Ramdani et al. ............ 438/350 |
| 7,538,002 | B2 * | 5/2009 | Zhang et al. ............ 438/296 |
| 7,704,835 | B2 * | 4/2010 | Singh et al. ............ 438/267 |
| 2001/0012693 | A1 | 8/2001 | Talwar et al. |
| 2002/0048890 | A1 | 4/2002 | Wieczorek et al. |
| 2002/0063084 | A1 | 5/2002 | Lin et al. |
| 2002/0104756 | A1 | 8/2002 | Shibasaki |
| 2002/0135017 | A1 | 9/2002 | Vogt et al. |
| 2002/0137297 | A1 | 9/2002 | Kunikiyo |
| 2002/0142616 | A1 | 10/2002 | Giewont et al. |
| 2002/0171107 | A1 | 11/2002 | Cheng et al. |
| 2003/0038323 | A1 | 2/2003 | Kotani |
| 2003/0042515 | A1 | 3/2003 | Xiang et al. |
| 2003/0045131 | A1 | 3/2003 | Verbeke et al. |
| 2003/0098479 | A1 | 5/2003 | Murthy et al. |
| 2003/0124840 | A1 | 7/2003 | Dubin |
| 2004/0041216 | A1 | 3/2004 | Mori |
| 2004/0053481 | A1 | 3/2004 | Chakravarthi et al. |
| 2004/0118812 | A1 | 6/2004 | Watkins et al. |
| 2004/0119102 | A1 | 6/2004 | Chan et al. |
| 2004/0132291 | A1 | 7/2004 | Lee et al. |
| 2005/0090066 | A1 | 4/2005 | Zhu et al. |
| 2005/0106838 | A1 * | 5/2005 | Lim et al. ............ 438/442 |
| 2005/0112817 | A1 | 5/2005 | Cheng et al. |
| 2005/0118769 | A1 | 6/2005 | Kammler et al. |
| 2005/0121719 | A1 | 6/2005 | Mori |
| 2005/0124126 | A1 | 6/2005 | Wu |
| 2005/0130434 | A1 | 6/2005 | Chien et al. |
| 2005/0153566 | A1 | 7/2005 | Han et al. |
| 2005/0176205 | A1 | 8/2005 | Chien et al. |
| 2005/0212015 | A1 | 9/2005 | Huang et al. |
| 2005/0252443 | A1 | 11/2005 | Tsai et al. |
| 2005/0272187 | A1 * | 12/2005 | Murthy et al. ............ 438/151 |
| 2005/0280102 | A1 * | 12/2005 | Oh et al. ............ 257/401 |
| 2006/0014366 | A1 | 1/2006 | Currie |
| 2006/0084235 | A1 * | 4/2006 | Barr et al. ............ 438/300 |
| 2006/0094215 | A1 | 5/2006 | Frohberg et al. |
| 2006/0099766 | A1 | 5/2006 | Jin et al. |
| 2006/0121688 | A1 | 6/2006 | Ko et al. |
| 2006/0131648 | A1 | 6/2006 | Ahn et al. |
| 2006/0145270 | A1 | 7/2006 | Choi |
| 2006/0151776 | A1 | 7/2006 | Hatada et al. |
| 2006/0151840 | A1 | 7/2006 | Maekawa |
| 2006/0154410 | A1 | 7/2006 | Choi et al. |
| 2006/0175686 | A1 | 8/2006 | Murata et al. |
| 2006/0202237 | A1 | 9/2006 | Huang et al. |
| 2006/0220148 | A1 | 10/2006 | Furukawa et al. |
| 2006/0252191 | A1 | 11/2006 | Kammler et al. |
| 2006/0281271 | A1 | 12/2006 | Brown et al. |
| 2007/0018205 | A1 | 1/2007 | Chidambarrao et al. |
| 2007/0042602 | A1 | 2/2007 | Watkins et al. |
| 2007/0057324 | A1 | 3/2007 | Tews et al. |
| 2007/0122954 | A1 * | 5/2007 | Liu et al. ............ 438/187 |
| 2007/0128782 | A1 * | 6/2007 | Liu et al. ............ 438/187 |
| 2007/0128789 | A1 * | 6/2007 | Lim et al. ............ 438/202 |
| 2007/0132013 | A1 | 6/2007 | Banerjee et al. |
| 2007/0132035 | A1 | 6/2007 | Ko et al. |
| 2007/0166937 | A1 | 7/2007 | Adetutu et al. |
| 2007/0202651 | A1 * | 8/2007 | Zhang et al. ............ 438/296 |
| 2008/0157131 | A1 * | 7/2008 | Singh et al. ............ 257/288 |
| 2009/0045411 | A1 * | 2/2009 | Lin et al. ............ 257/77 |
| 2009/0101942 | A1 * | 4/2009 | Dyer ............ 257/288 |
| 2009/0152634 | A1 * | 6/2009 | Grant ............ 257/368 |
| 2010/0065922 | A1 * | 3/2010 | Han et al. ............ 257/384 |

OTHER PUBLICATIONS

Branebjerg et al., "Dopant Selective HF Anodic Etching of Silicon," Mesa-Institute, University of Twente, 1991 IEEE, pp. 221-226, Enschede, The Netherlands.

Chau et al., "A 50nm Depleted-Substrate CMOS Transistor (DST)," 2001 IEEE, Intel Corporation, Hillsboro, Oregon, 4 pages.

Cohen et al., "A Self-Aligned Silicide Process Utilizing ION Implants for Reduced Silicon Consumption and Control of the Silicide Formation Temperature," vol. 716, 2002 Materials Research Society, pp. B.1.7.1-B1.7.6, Yorktown Heights, New York.

Ghani et al. "A 90nm High Volume Manufacturing Logic Technology Featuring Novel 45nm Gate Length Stained Silicon CMOS Transistors," 2003 IEEE, Intel Corp., Hillsboro, Oregon, 3 pages.

Nojiri et al., "Bias-Dependent Eching of Silicon in Aqueous Ammonia," Central Engineering Lab, Nissan Motor Co., 1991 IEEE, pp. 136-139, Yokosuka, Japan.

Van Den Meerakker et al., "A Mechanistic Study of Silicon Etching in NH3/H2O2 Cleaning Solutions," Philips Research Lab., J. Electrochem. Soc., vol. 137, No. 4, pp. 1239-1243, Eindhoven, The Netherlands, Apr. 1990.

Van Meer et al., "70nm Fully-Depleted SOI CMOS Using a New Fabrication Scheme: The Spacer/Replacer Scheme," IMEC, Leuven, Belgium, 2 pages, Aug. 7, 2002.

Van Zant, Peter "Microchip Fabrication, A Practical Guide to Semiconductor Processing," Fifth Edition, 2004, pp. vii-xii, 73-96, 98, 100, 103-105, 268, and 495-501.

Wang et al., "Selective Etching on N-Type Silicon Using Pulsed Potential Anodization," General Motors Research Lab., 1991 IEEE, pp. 819-822, Warren, Michigan.

Wolf et al., "Silicon Processing for the VLSI Era vol. 1: Process Technology," ISBN 0-91672-3-7, University of California, Sunset Beach, California, pp. 521-542, Lattice Press, 1986.

U.S. Appl. No. 11/231,647, filed Sep. 21, 2005, Office Action mailed May 30, 2008.

U.S. Appl. No. 11/231,647, filed Sep. 21, 2005, Final Office Action mailed Dec. 23, 2008.

U.S. Appl. No. 11/231,647, filed Sep. 21, 2005, Notice of Allowance mailed Apr. 1, 2009.

* cited by examiner

SEMICONDUCTOR DEVICE AND METHOD OF MANUFACTURING A SEMICONDUCTOR DEVICE

CROSS-REFERENCE TO RELATED APPLICATION(S)

The present application is a divisional of U.S. patent application Ser. No. 11/231,647, filed on Sep. 21, 2005, entitled "Semiconductor Device and Method for Manufacturing a Semiconductor Device," which is incorporated in its entirety by reference herein.

FIELD OF THE DISCLOSURE

The present disclosure relates generally to a semiconductor manufacturing method, and more particularly to methods of transistor formation during a manufacturing process.

DESCRIPTION OF THE RELATED ART

The use of shallow trench isolation (STI) structures to define source/drain regions to separate devices (transistors) from other devices (transistors) is routinely employed in the semiconductor manufacturing industry. The trend toward smaller device sizes has resulted in higher source/drain resistance due to decreased contact size. The ability to provide a device having source drain regions with a lower resistance would be useful.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

The present disclosure provides for a semiconductor device having a conductive gate structure overlying major surface of a semiconductor layer adjacent to an isolation structure. The isolation structure, such as a shallow trench isolation structure, includes an isolation material recessed below the major surface of the semiconductor layer to form a sidewall portion from a source/drain active region. An epitaxial layer is formed on exposed portions of the source/drain major surface and sidewall. The present disclosure may be better understood with reference to FIGS. 1 through 6.

Figure 1:
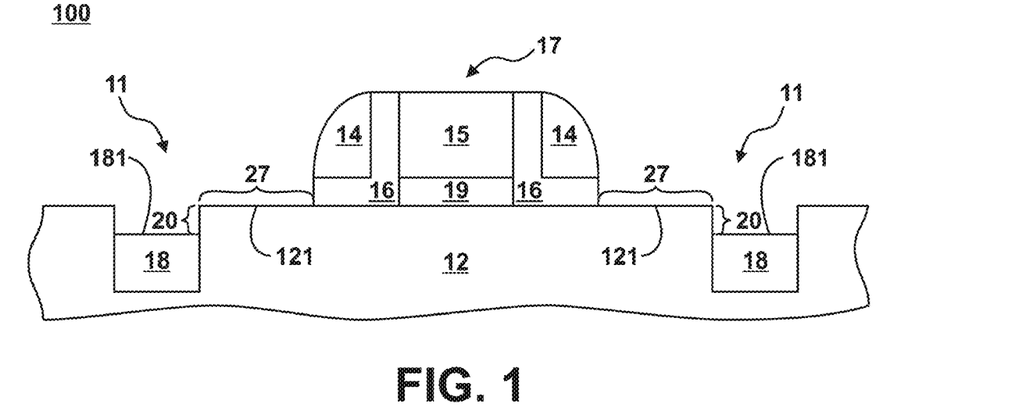
FIG. 1 through 5 illustrate, in cross-section, a location of a semiconductor wafer where a transistor is being formed according to at least one embodiment of the present disclosure.

FIG. 1 illustrates a cross-sectional view of a location 100 of a semiconductor wafer where a transistor structure is being formed. At FIG. 1, a gate structure 17 and isolation structures 11 have been formed. The gate structure 17 includes a conductive gate 15 overlying a gate dielectric 19, and a sidewall structure that includes liners 16 and spacers 14, all of which overlie a semiconductor substrate 12. Isolation structures 11, such as shallow trench isolation structures, have been formed at isolation regions of location 100 adjacent to a gate region to define outer locations of active area 27 associated with source/drain regions of the transistor being formed. A major surface of the semiconductor substrate at the source/drain regions is labeled with reference number 121.

Substrate 12 can comprise a single layer substrate, for example a semiconductor substrate such as a mono-crystalline silicon substrate. Substrate 12 can also include other materials, e.g., a semiconductor layer and an insulative layer, such as a silicon-on-insulator, silicon on sapphire substrate, or other semiconductor materials such as gallium arsenide, and the like. Conductive gate 15 generally comprises polycrystalline or amorphous silicon having a width ranging from 25 to 1000 nm, and a height ranging from 25 to 200 nm. The sidewall structures of gate structure 17 can include multiple spacer and liner combinations, and can be an oxide, a nitride, or other combinations of materials known in the art.

Specifically illustrated in FIG. 1 is an STI structure 11 comprising an isolation material 18 that is an electrically insulative material such as an oxide. The isolation material 18 is recessed such that surface 181 of the isolation material 18 is below the major surface 121 of substrate 12. In one embodiment, the depth of an isolation structure 11, i.e. the recess depth 20, can vary depending upon specific design requirements. Where substrate 12 is an SOI substrate, and source/drain regions are bottomed out to the buried oxide of the SOI, the recess depth 20 can be deeper than the thickness of the active silicon layer of the SOI substrate, which is likely to be deeper than 200 nanometers. For bulk substrate technology, the recess depth 20 will vary depending upon the depth of the source/drain regions to avoid the possibility of spiking the source/drain junction during subsequent silicidation processes. For example, devices having relatively shallow source/drain regions will have a smaller recess depth 20, or no recess, than devices having deeper source/drain regions which can have a recess depth of approximately 300-1000 nm or more. It is typically desirable to keep the surface 181 sufficiently above a source/drain junction to reduce the likelihood of spiking. For example, the surface 181 can be approximately 20 nm above the source/drain junction. In various embodiments, the isolation material is recessed by approximately 200 nm, 300 nm, 500 nm, or 300-1000 nm.

The recessed isolation structure 11 can be formed either prior or subsequent to formation of gate structure 17 using conventional or proprietary formation techniques. For example, where the isolation structure 11 is an STI structure, an opening can be formed by etching to expose sidewall portions of the active region 27, forming an isolation material within the opening, and etching the isolation material to provide recessed surface 181 a depth 20.

The surface orientation of isolation material 18 is substantially parallel to a surface orientation of the adjacent active area 27 of the source/drain regions. The surface orientation of the isolation material 18 is considered to be an average across the surface, i.e. a cross-section, of the isolation material 18 and not just a specific location of its surface. The term substantially parallel is used to further indicate that the surface orientation of surface 181 is within +− 30 degrees of being parallel to the surface orientation of the active region 27, to further accommodate for variations in processing.

Figure 2:
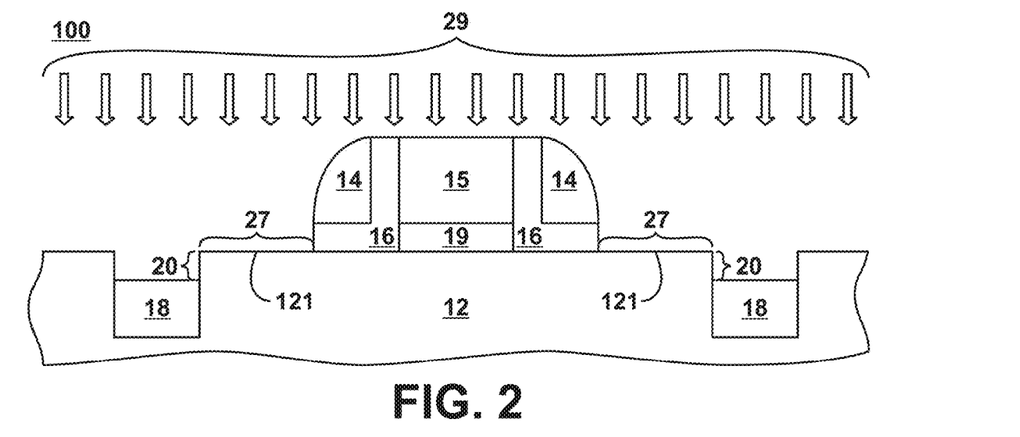
Figure 3:
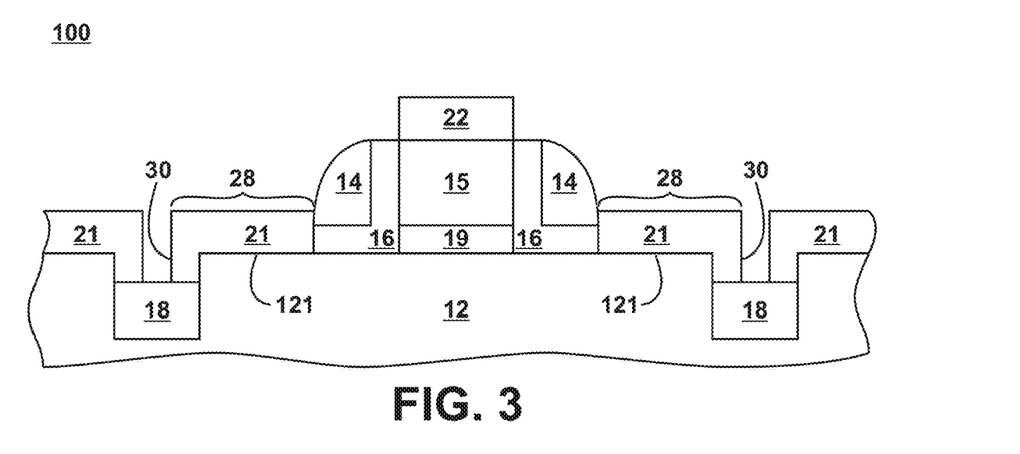

FIG. 2 illustrates region 100 being exposed to an epitaxial process 29 that forms an epitaxial layers 21 and 22 as illustrated in FIG. 3. Epitaxial layers 21 and 22 are formed at active region 27 and conductive gate 15 respectively. Epitaxial formation is typical accomplished using selective epitaxial growth (SEG) techniques to define regions where epitaxial layers are formed. Formation of epitaxial layer 22 at the conductive gate structure can be prevented by capping the conductive gate 15 with a material selective to the epitaxial formation to prevent formation of layer 22. Epitaxial formation at active region 27 results in an horizontal epitaxy component 28, which is substantially parallel to the major surface 121, and a vertical epitaxy component 30, which is substantially perpendicular to the major surface 121. Note that epitaxial layer 21 is formed between conductive gate 15 and the location of the isolation material 18 and the epitaxial layer 21 abuts the material 18. These epitaxial layers contribute a raised source/drain regions. The thickness of the epitaxial layer generally ranges from 5 to 50 nm. In order to prevent shorting between opposing sidewalls of an isolation structure, a width of the isolation region will typically be approximately three times a thickness, or more, of the epitaxial layer 121.

Figure 4:
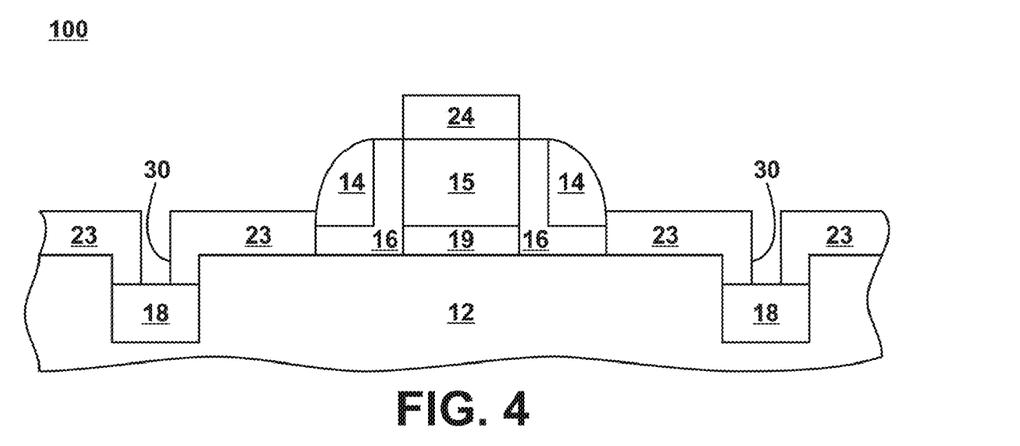

FIG. 4 illustrates the region 100 after a silicidation process resulting in silicide layers 23 and 24. The silicide layers 23 and 24 are typically formed in a conversion process known in the art using material donated from the epitaxial layers 21 and 22, and possibly the underlying semiconductor layer, at which source/drain regions are formed. The silicide layers 23 and 24 can include a cobalt (di)silicide, a nickel silicide, or other silicides known in the art.

Figure 5:
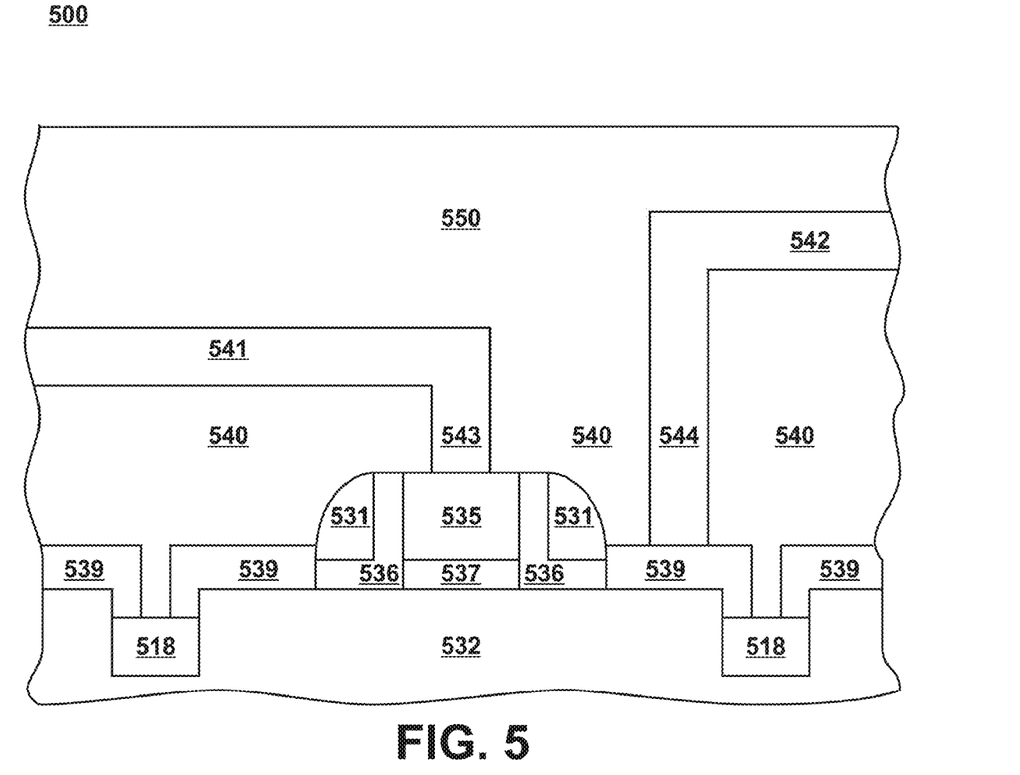

FIG. 5 illustrates a cross-sectional view of a portion 500 of a semiconductor device manufactured according to an embodiment of the present disclosure. FIG. 5 is a simplified diagram that does not show all features of portion 500 in order to keep the illustration from being cluttered. Specifically illustrated in FIG. 5 are: substrate 532; isolation structures having isolation material 518; silicide 539 that includes raised source drain regions; a gate structure that includes dielectric 537, conductive gate 535, sidewall liner 536, and spacer 531; dielectric material 540 residing between conductive layers; and a dielectric layer 550 to form a passivation layer.

Figure 6:
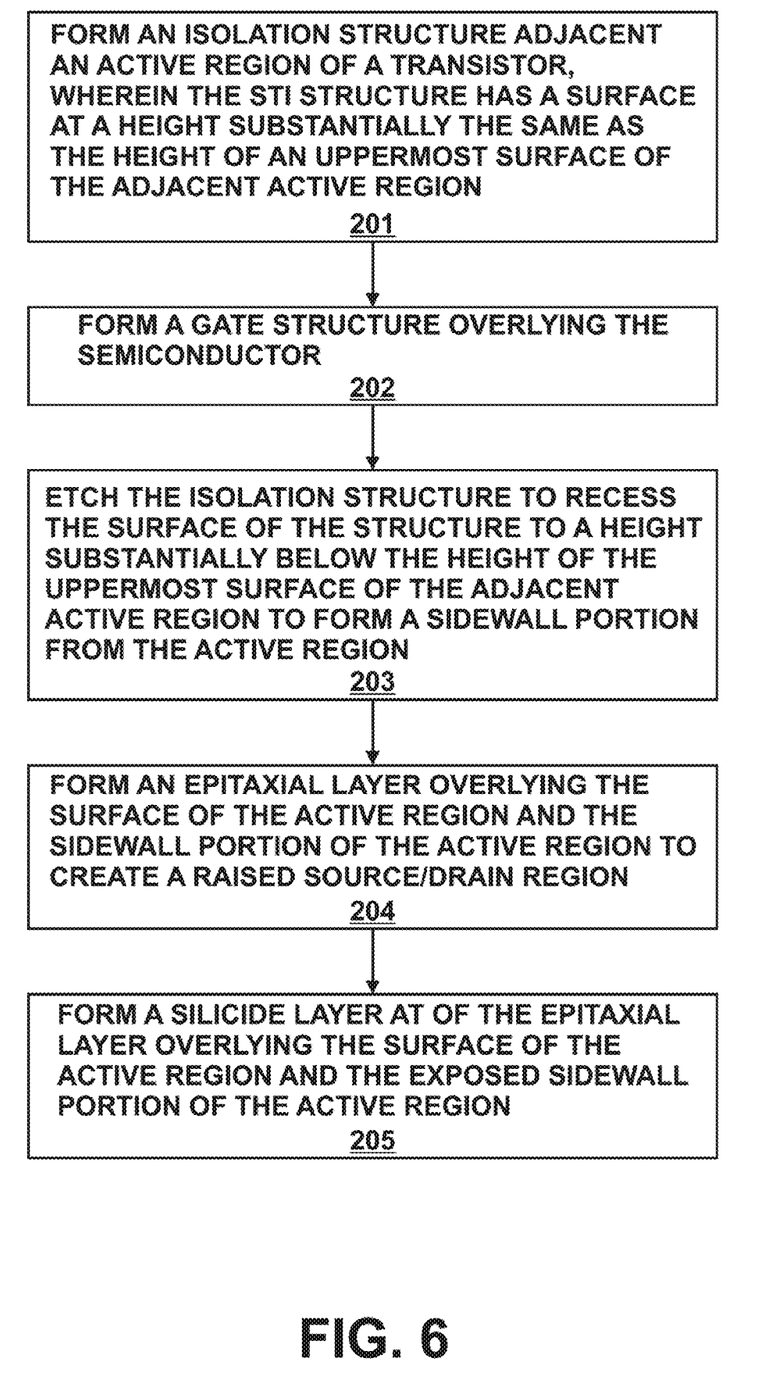
FIG. 6 illustrates, in flow diagram form, a method in accordance with a specific embodiment of the present disclosure.

FIG. 6 illustrates a flow diagram of a method in accordance with the present disclosure. At step 201, an isolation structure, such as a STI structure, is formed adjacent to an active region of a transistor and has a surface height that is substantially the same as a surface of the adjacent active region to which it abuts. The isolation structure will typically have a height that is substantially the same as the adjacent active region after a pluralization process involved in the formation of the structure. In one embodiment, formation of the isolation structure includes forming an opening, i.e., the STI trench, forming an isolation material layer overlaying the opening and pluralizing the surface of resulting structure to form the STI structure.

At step 202 a gate structure is formed overlying the substrate.

At step 203, the isolation structure is etched to form an opening that exposes sidewall portions of an adjacent active region, whereby the surface of the isolation structure is recessed. In one embodiment, step 203 occurs prior to gate structure formation of step 202. In an alternate embodiment step 203 occurs subsequent to gate structure formation of step 202, and involves the formation of a mask layer overlaying the substrate to protect areas from the etch of step 203. The isolation structure can be recessed through the use of wet or dry etch processes. With STI techniques, the isolation structure is typically pluralized using a chemical mechanical polishing (CMP) technique at step 201, and subsequently etched using one or more non-mechanical techniques, to recess the structure such as various wet or dry etch processes that can selectively recess the isolation material relative to adjacent active areas. Note that initial formation of STI features using CMP can result in dishing of the isolation structures. This dishing affect, however, does not provide sufficient exposure, if any, to sidewalls of the adjacent active areas to provide for improved source/drain resistance.

At step 204 an epitaxial layer is formed overlying the major surface of the active region and the sidewall surface of the active region to create a raised source drain region.

At step 205, a silicide layer is formed at the epitaxial layer overlying the surface of the active region and the exposed sidewall portion of the active region.

The method and apparatus herein provides for a flexible implementation. Although described using certain specific examples, it will be apparent to those skilled in the art that the examples are illustrative, and that many variations exist. For example, the disclosure is discussed herein primarily with regard to shallow trench isolation feature spacer processes prior to SEG and silicidation for a CMOS device, however, the disclosure can be employed with other device technologies. In addition, formation of the STI spacer can also result in spacer material abutting the gate structures, which is not illustrated.

For example, it will be appreciated that any number of substrate preclean steps can occur before the formation of any epitaxial layer. For example, U.S. patent application having Ser. No. 10/791,346, which is hereby incorporated in its entirety by reference, discloses several substrate preclean techniques appropriate for cleaning a substrate prior to forming an epitaxial layer.

In one example, contaminates on the surface of a substrate are subjected to a cleaning process comprising applying a plasma to a surface of the active regions produce a reduction reaction with the contaminates in an upper portion of the surface of the active regions. In an embodiment, the plasma comprises $H_2$. While the plasma is being applied to the upper portion of the exposed active regions, the resultant products or vapor byproducts of the reduction reaction are removed by the normal vacuum process within the chamber. Therefore, contaminates contained in the vapor byproducts and are vented away, leaving the upper portion of the surface of the active regions suitably clean for the ensuing epitaxial process. In one embodiment, the plasma process parameters comprise a gas flow of 450 sccm H2 and 300 sccm argon, at a chamber temperature of 400 degrees Celsius, with an high frequency (HF) power setting of 700 W, and a low frequency (LF) power setting of between approximately 50 to 100 W. Chamber pressure is 1 Torr, and the spacing between the surface of the active region and the faceplate of the tool (not shown) should be 300 mils. In other embodiments, plasma process parameters comprise a gas flow ranging from between 100-800 sccm $H_2$ and from between 100 and 600 sccm argon. Chamber temperatures can range between 300 to 450 degrees Celsius, and HF power settings from between 400-900 W, with LF power settings varying from between 0-150 W. Chamber pressures can range from between 1 mT-5 Torr, with spacing between the surface of the active region and the faceplate of the tool varying from between 200 to 400 mils. Exposure times for the various embodiments utilizing plasma range from between approximately 10 seconds up to approximately 120 seconds.

Various tool types are suitable for this cleaning, for example, CVD (Chemical Vapor Deposition) equipment, HDP (High Density Plasma) tools, etch chambers, or the like. Differences in chamber design, power settings, and species, e.g., $H_2$ with or $H_2$ without helium or nitrogen, will result in different thickness of the layer after anneal. Typically the layer after anneal will be between 20 and 50 Angstroms thick. This plasma cleaning process also results in passivation of Si—H bonds in the layer after anneal. No wet cleaning dip with hydrofluoric (HF) acid prior to SEG is necessary.

In addition to no longer requiring an HF dip prior to SEG, the reduced temperature of this $H_2$ plasma cleaning treatment results in a reduction of the SEG process thermal budget of more than 100 degrees Celsius. Typically pre-SEG cleaning processes are conducted at approximately 900 degrees Celsius or greater. In an embodiment of the present disclosure, the cleaning process occurs at less than approximately 800 degrees Celsius. In another embodiment, the cleaning process occurs at less than approximately 500 degrees Celsius or less. In addition, the cleaning processes of the present disclosure could be conducted at less than approximately 700 degrees Celsius or less, or even at less than approximately 600 degrees Celsius or less.

In another embodiment, location including includes a gate structure and active regions is subjected to a cleaning process utilizing a low-power dry etch to selectively remove an upper atomic layer of material from the active regions. The thickness of the upper atomic layer of material to be removed ranges from between 20 to about 50 Angstroms. In one embodiment, the dry etch process is an anisotropic dry etch utilizing a carbon-free gas as an etchant gas. In another embodiment, the anisotropic dry etch utilizes an oxygen- and carbon-free gas as an etchant gas. The etchant gas can comprise HBr, $NF_3$, $SF_6$, gaseous fluorine-interhalogenics such as $ClF_3$, or any gas containing fluorine, suitable to disassociate F-radicals, which does not contain oxygen and carbon. Prior to undergoing the anisotropic dry etch process, location 200 is subjected to a standard wet etch chemistry process utilizing a dilute HF solution (100:1) at room temperature, e.g., 20 to 26 degrees Celsius, for a time period ranging from 50 to 200 seconds. Following the HF clean, a low-power dry etch utilizing a temperature of approximately 400 degrees Celsius, RF power of approximately 375 W, pressure of approximately 150 mTorr, and a gas flow rate ranging from 50 to 100 sccm, is conducted. In other embodiments, the low-power dry etch utilizes a temperature ranging from between 300-500 degrees Celsius, with RF power ranging from between 200-700 W, a pressure ranging between 0-1 Torr, and a gas flow rate ranging from between 10-300 sccm, for a time ranging between 10 to 60 seconds.

This low-power dry etch removes carbon and oxygen contamination, and provides a very clean surface for SEG. The low temperature HF clean followed by the low-power dry etch does not require a high temperature bake. This results in a reduction of thermal budget for SEG of more than 100 degrees Celsius.

In another embodiment, a cleaning process is used that forms an oxidation layer of between 20 to 50 Angstroms on an upper surface of the active regions using a plasma to produce the oxidation layer on doped active regions. In an embodiment, the plasma is an $O_2$ plasma. In another embodiment, the plasma is an $O_3$ plasma.

An $O_2$ plasma production utilizes $O_2$ gas at a flow rate of 400 sccm, a pressure of 5 Torr, an HF of 300 W, an LF of 100 W, and a temperature of 400 degrees Celsius, with the time ranging from between about 10 to about 120 seconds. The spacing between the surface of the active regions and the faceplate of the vapor deposition apparatus (not shown) should be 400 mils. In other embodiments, the plasma production utilizes $O_2$ gas at a flow rate of between 100 and 1000 sccm, a pressure ranging from between 2-10 Torr, an HF ranging between 200-500 W, an LF ranging between 50-200 W, a temperature ranging between 300-450 degrees Celsius, for a time ranging from between approximately 10 to approximately 120 seconds. In an embodiment, the spacing between the surface of the active regions and the faceplate of the vapor deposition apparatus ranges from between 200 and 600 mils. The tool type used to generate the plasma could be CVD equipment, HDP tools, or etch chambers. In an embodiment where the plasma is $O_3$, plasma production utilizes $O_3$ gas at a flow rate of 300 sccm, a pressure of 5 Torr, an HF of 300 W, an LF of 100 W, and a temperature of 400 degrees Celsius for a time period ranging from between 10 to 120 seconds. The spacing between the surface of the active regions and the faceplate of the vapor deposition apparatus (not shown) should be 400 mils. In other embodiments, plasma production utilizes $O_3$ gas at a flow rate of between 50 and 600 sccm, a pressure ranging from between 2-10 Torr, an HF ranging between 200-500 W, an LF ranging between 50-200 W, and a temperature ranging from between 300-450 degrees Celsius for a time period ranging from between about 10 to about 120 seconds. In an embodiment, the spacing between the surface of the active regions and the faceplate of the vapor deposition apparatus ranges from between 200 and 600 mils. As was the case with the $O_2$ plasma, the tool type used to generate the plasma could be HDP tools, CVD equipment, or etch chambers.

Forming the oxidation layer facilitates trapping or fixing contamination in the oxide layer overlying the upper layer of the doped active regions for subsequent removal using a wet chemistry process. The wet etch chemistry process utilizes a dilute HF acid solution of 100:1 at room temperature, e.g. 20 to 26 degrees Celsius, for a time ranging from 50 to 200 seconds. Differences in chamber design, power settings and species employed, e.g., $O_2$ or $O_3$, results in differing thickness of the oxidation layer, hence the wide range in times for the HF dip. The use of an $O_2$ or $O_3$ plasma to create a contamination-trapping oxidation layer for removal by a room temperature HF dip results in a reduction of the thermal input for location 300.

Another possible pre-clean, different from the one described above, prior to formation of an SEG that facilitates a reduced temperature $H_2$ bake is performed following formation of any desired spacers, which can comprise one or more nitride or oxide layers and prior to SEG formation. This pre-clean and comprises a first pre-rinse with deionized water, followed by an oxide etch utilizing an aqueous solution of deionized water and hydrofluoric acid (HF or hydrogen fluoride in water) aqueous solution of approximately 30:1 (volumetric ratio) at 21 degrees Celsius, for a time period ranging from between 50-60 seconds. The weight percentage of HF recommended for the HF aqueous solution is 49% in a balance of deionized water ($H_2O$). Bulk HF aqueous solution can be purchased from various chemical suppliers in the HF weight percent range of 10% to 49%. In semiconductor fabrication facilities, this aqueous HF aqueous solution is typically diluted in the range 10:1 to 200:1. A 10:1 HF is 1 part aqueous HF (at 49% weight percent) and 10 parts $H_2O$. It will be appreciated that the etch rate of the HF aqueous solution is substantially linear with respect to both the concentration of the HF aqueous solution and the etch time. Therefore, various combinations of HF concentrations and etch times can be used to accomplish the oxide etch. Additionally, the temperature may vary.

After the HF etch, an overflow rinse utilizing deionized water is performed for a period ranging from approximately 120 to 600 seconds with a typical rinse being about 400 seconds. The cleaning process of portion 100 results in etching away of the surface contamination/debris located on substrate 10 resulting from offset spacer formation and/or dopant implantation. The upper semiconductor surface, i.e. silicon surface, of substrate 10 is also slightly etched, for example, from one to several mono layers of silicon, during the HF etch.

It should be noted that the amount of material removed during the HF etch is dependent upon the type of material being removed. For example, when native oxide is present, the HF etch will remove approximately 20 to 30 Angstroms of oxide. If a deposited oxide layer is present in addition to a native oxide, an over-etch of approximately 30% is generally desirable. For example, if removal of 100 Angstroms of a chemical vapor deposition (CVD) oxide is desired, the HF etch could be employed to remove approximately 120 to 130 Angstroms oxide removal. This latter example would be applicable in applications where a liner oxide of approximately 100 Angstroms thickness is employed between a conductive gate 25 and a nitride spacer.

The next steps in the cleaning process comprise a second pre-rinse with deionized water of approximately 30 seconds duration precedes the performance of a Standard Clean-1 (SC-1), a quick dry rinse (QDR), and a Standard Clean-2 (SC-2). The SC-1 and SC-2 components are followed by a second QDR, and an $HF:H_2O$ etch, a third rinse, and an isopropyl alcohol (IPA) dry. The amount of material removed by the SC-1 and SC-2 components are implemented such that they etch from approximately one monolayer of silicon to approximately 10 to 100 Angstroms of silicon.

In an embodiment, the SC-1 utilizes an aqueous solution of ammonium hydroxide:hydrogen peroxide:deionized water at a ratio of approximately 1:1-4:6-40, at a temperature of approximately 60 degrees Celsius for approximately 72 minutes, to etch approximately 100 Angstroms of silicon. Synonyms for ammonium hydroxide ($NH_4OH$) include ammonia solution (typically contains between 12% and 44% ammonia before dilution), dilute ammonia, or concentrated ammonia. A first quick dry rinse is conducted for approximately 3 minutes. In an embodiment, the SC-2 utilizes a solution of hydrochloric acid:hydrogen peroxide:deionized water at an initial ratio of approximately 1:1:50 at a temperature of approximately 60 degrees for about 5 minutes. A second quick dry rinse is then conducted. Synonyms for hydrochloric acid (HCl) are hydrogen chloride, anhydrous hydrogen chloride, aqueous hydrogen chloride, chlorohydric acid, spirit of salts, and muriatic acid.

In a particular embodiment, the SC-1 utilizes a solution of ammonium hydroxide:hydrogen peroxide:deionized water at a ratio of approximately 1:4:20 at a temperature ranging of approximately 60 degrees Celsius for approximately 72 minutes. The SC-1 is the step in the clean sequence that etches the silicon. This occurs because the $H_2O_2$ (the oxidizer) becomes depleted in the solution with increasing time and increasing temperature. The methods of the present disclosure allow the initial concentration of hydrogen peroxide to be depleted to facilitate etching of the upper-most semiconductor portion. Depletion of the $H_2O_2$ is greatly enhanced when the solution temperature rises above 80 degrees Celsius, which can lead to an etch that is difficult to control if not carefully monitored. The temperature range of the SC-1 is expected to be approximately 55 to 85 degrees Celsius, with the etch occurring in a shorter period of time at higher temperatures than at lower temperatures. It is expected that the SC-1 etching will be better controlled at temperatures in the range of 55-80 degrees Celsius and better still at temperatures in the range of 55-75 degrees Celsius. Generally, it is expected that the substrate will be exposed to the SC-1 etch process for longer that 60 minutes. When the oxidizer stops protecting the silicon surface, the ammonium hydroxide ($NH_4OH$) starts to etch the silicon. Thus, a small amount of silicon can be etched in a controlled manner. The SC-1 can be performed in a re-usable bath where the solution is re-circulated and heated to maintain the desired temperature.

The mechanism of silicon and $SiO_2$ etching by a $NH_4OH/H_2O_2$ solution occurs when the solution is allowed to be depleted of $H_2O_2$. An alkaline solution, such as NH4OH4 in our example, will attack silicon by water molecules, according to the reaction:

$$Si+2H_2O+2OH^- \rightarrow Si(OH)_2(O^-)_2+2H_2\uparrow$$

A passivation layer formed by the $H_2O_2$ prevents this attack by the $NH_4OH$. $H_2O_2$ decomposes in the course to form $O_2$ and $H_2O$.

$$H_2O_2 \rightarrow H_2O+\tfrac{1}{2}O_2$$

When the concentration of $H_2O_2$ is below $3\times10^{-3}M$, then silicon will begin to etch, because of the absence of the inhibition layer.

As indicated in the above equations, heat is given off as the $H_2O_2$ is depleted. If a bath is used that is not recharged with fresh solution all $H_2O_2$ will be depleted, thereby no longer releasing heat. Therefore, the temperature can be monitored on the low end to indicate when the solution should be refreshed, while the temperature on the high end is monitored to prevent unusually rapid decomposition of the $H_2O_2$, which can lead to a process that is difficult to control.

The first quick dry rinse is conducted for approximately 3 minutes. The subsequent SC-2 utilizes a solution of hydrochloric acid:hydrogen peroxide:deionized water at a ratio of approximately 1:1:50 at a temperature of approximately 60 degrees for about 5 minutes. A quick dry rinse with deionized water, followed by an IPA dry process, is performed following the SC-2.

The IPA dry process uses a heated IPA vapor at approximately 82 degrees Celsius. The IPA vapor is generated in a separate chamber with 100% $N_2$ bubbled through 100% IPA (heated to 82 degrees Celsius). The IPA condenses on the wafer, and the solution drips off the bottom of the wafer. The IPA vapor concentration is slowly diluted to 100% $N_2$ before the wafers are removed from the rinsing/drying tank.

Subsequent to the SC-1 and SC-2 processes, the substrate will be further recessed (etched) as a result of the cleaning process. Next, an HF:H2O etch can be conducted at an aqueous solution ratio of 200:1 for about 65 seconds, which typically results in approximately 30 Angstroms of oxide removal. The HF:H2O etch 8 is followed by a rinse with deionized water for approximately 10 minutes duration. The deionized water rinse is followed by an IPA dry as described in the preceding paragraph. At this time, the source/drain regions of the substrate are ready for ion implantation or selective epitaxial growth.

In a particular embodiment, the SC-1 process comprises a pre-rinse with deionized water of approximately 30 seconds duration. The pre-rinse is followed by a SC-1 solution at a ratio of approximately 1:1-4:6-40, which includes the subranges of 0.25:1:5, 0.5:1:5, 1:1:5, 1:1:6, 1:4:20, and 1:1:40, ammonium hydroxide:hydrogen peroxide:deionized water at a temperature of approximately 60 degrees Celsius for approximately 5 minutes. A quick dump rinse (QDR) is then performed for approximately 3 minutes.

Following the SC-1 cleaning process, an SC-2 cleaning process is performed. In an embodiment, the SC-2 cleaning process includes utilizing an aqueous solution of hydrochloric acid:hydrogen peroxide:deionized water at a ratio of approximately 1:1:50 at a temperature of approximately 60 degrees Celsius for approximately 5 minutes. A QDR is then performed, and portion 200 is ready for the third cleaning. The weight percent composition of the hydrochloric acid: hydrogen peroxide:deionized water is 29% (weight percent) hydrochloric acid and 30% (weight percent) hydrogen peroxide in a balance of deionized water.

After the SC-1 and SC-2, a third cleaning process comprising an approximate 30 second pre-rinse, an oxide etch, an overflow rinse and an IP dry is performed. The oxide etch is accomplished utilizing a solution of deionized water and hydrofluoric acid at a ratio of approximately 200:1 for a time period ranging from between 450-650 seconds. Following the HF etch, an overflow rinse is performed for approximately 10 minutes. A final isopropyl alcohol (IPA) dry is then performed. Approximately 120-140 Angstroms of the surface of substrate 20 is removed in this process. Portion 200 is ready to undergo selective epitaxial growth.

The above-described cleaning process has been found to facilitate formation of an epitaxial layer on a semiconductor surface, specifically silicon. Because various etch processes can etch N- and P-type regions at different rates, it can be useful to amorphize an upper-most surface of the source/drain regions prior to the above-described clean to reduce any preferential etch differences between substrate regions of differing dopant types.

For example, the above-described clean process can etch the N-type silicon preferentially, as compared to the P-type silicon, resulting in a quality difference of the SEG between the N and P regions after SEG processing. Etch rate differences between N- and P-type regions can allow for contaminates to remain in the lesser-etched region. For example, an etch process that does not etch P-type regions at the same rate as N-type regions can result in P-regions maintaining embedded carbon that is incorporated from previous process steps. Without appropriate etching of silicon in the P-type regions during the clean, the carbon will remain, and the SEG will grow inconsistently. A high bake temperature of 900° C. can be used to overcome this growth issue on P areas, however, as stated previously, high bake temperatures can be detrimental to the device in that it causes diffusion and deactivation of the dopants. Amorphizing the source/drain regions can reduce etch differences associated with the above-described cleaning process as well as other processes that are used to etch doped substrate regions, thereby improving the quality of both the N and P regions.

It has been observed that the selective etching may be P-type over N-type, or N-type over P-type depending on the solution temperature, flow rate of the aqueous ammonia, concentration of the aqueous ammonia, agitation, or illumination of light. By amorphizing the silicon in this manner to a predefined depth, it has been observed that unbiased etching to the depth of the amorphized silicon can be achieved.

In one embodiment, N- and P-type extensions formed in the source/drain regions are amorphized by being implanted with the Xe, at a dose of 2E14 and energy of 10 keV, to create an amorphous depth of 100 A.

In accordance with another embodiment, a spacer structure having an undercut can be used to reduce or inhibit facet formation during a selective epitaxial growth process. Such a process can allow for greater lateral uniformity of junction or silicide features during implantation or silicidation processes, and can be accomplished by using a spacer formed with a bi-layer of materials, e.g., a thin liner, such as portion 29 of FIG. 1, of one material underlying another layer of material from which the 'main' spacer is formed. The thin liner and other material layer are selected such that the two materials are selectively etchable with respect to the other, for example, a thin oxide liner and a nitride layer. By etching the underlying portion of the spacer, an undercut can be formed that reduces facets during epitaxial formation.

In addition, a number of etch chemistries can be used to form nitride spacers. These etch chemistries are known in the art, and include the use of gas mixtures such as NF3/HBr, CF4/HBr, SF6/HBr, or any combination of these gases. In an embodiment, helium or argon can be included in the gas mixture to dilute the etch chemistry.

To improve the selectivity of the nitride etch over oxide, oxygen (O2) can be added to the gas mixture flowing into the plasma reactor during etch. In an embodiment, the addition of oxygen during the etching process is an amount between 2 percent and 15 percent by volume. The plasma reactor may be of any type which provides ion bombardment, e.g., capacitively-coupled parallel-plate reactor, or inductively coupled plasma with wafer (RF) bias. The wall temperature of the plasma reactor during etching is between 20 degrees C. and 60 degrees C., while the wafer platen (chuck) temperature is between 50 degrees C. and 80 degrees C. The gas mixture has a total gas flow during etching of between 75 sccm and 150 sccm for 200 mm wafers. The total gas flow would require an increase for 300 mm wafers, in order to compensate for the increase in the plasma reactor chamber volume. The chamber pressure is in the range of 50-150 mtorr for 200 mm wafers using capacitively coupled plasma reactor systems. It should be noted that the chamber pressure necessarily depends upon the size of the chamber, as well as the manufacturer of the plasma reactor equipment. The examples presented herein reference Applied Material's MERIE (magnetically enhanced reactive ion etch) systems.

The amount of oxygen added is dependant upon the particular etch chemistry chosen. An exemplary etch chemistry could be CF4, HBr, and He—O2, with gas flow ratios, by volume, of CF4:HBr:He—O2 of approximately 10:(2-6):(1-6). The ratio of He—O2 used is 70/30 percent by volume, however, other appropriate ratios would work as well. In an embodiment, addition of oxygen during the etching process is an amount between 2% and 15% by volume. The addition of oxygen does not greatly alter the resultant spacer 16 profiles, although small alterations are possible. This could, however, be compensated for by changing (i.e., increasing or decreasing) the thickness of nitride layer (14, FIG. 1). Hence the addition of oxygen during the etching process does not require adjustments of other etch process parameters. The addition of oxygen enhances the etch selectivity of the nitride layer 14 to the liner oxide layer 15. In an embodiment, the etch selectivity for silicon nitride is between 1:2 and 1:3.

Additionally, various types of deposition and etch devices are currently available that could be suitable for use in employing the method as taught herein. Note also, that although an embodiment of the present disclosure has been shown and described in detail herein, along with certain variants thereof, many other varied embodiments that incorporate the teachings of the disclosure may be easily construed by those skilled in the art. Benefits, other advantages, and solutions to problems have been described above with regard to specific embodiments. However, the benefits, advantages, solutions to problems, and any element(s) that may cause any benefit, advantages, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents as can be reasonably included within the spirit and scope of the disclosure.

The disclosure herein provides for a flexible implementation. Although described using certain specific examples, it will be apparent to those skilled in the art that the examples are illustrative, and that many variations exist. For example, the disclosure is discussed herein primarily with regard to shallow trench isolation structures though extensions of the disclosure can be employed with other isolation technologies. Additionally, various types of deposition and etch devices are currently available which could be suitable for use in employing the method as taught herein. Note also, that although an embodiment of the present disclosure has been shown and described in detail herein, along with certain variants thereof, many other varied embodiments that incorporate the teachings of the disclosure may be easily construed by those skilled in the art. Benefits, other advantages, and solutions to problems have been described above with regard to specific embodiments. However, the benefits, advantages, solutions to problems, and any element(s) that may cause any benefit, advantages, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents as can be reasonably included within the spirit and scope of the disclosure.

What is claimed is:

1. A device comprising:
   a first layer comprising a semiconductor material having a major surface;
   a gate dielectric of a gate structure on the first layer major surface at a first location;
   an isolation material at a second location, the isolation material comprising a surface recessed substantially below the first layer major surface; and
   an epitaxial layer on the first layer major surface between the first location and the second location and on a sidewall of the first layer abutting the isolation material.

2. The device of claim 1, wherein the first layer includes a bulk semiconductor substrate.

3. The device of claim 1, wherein the first layer includes an active semiconductor layer of a semiconductor-on-insulator substrate.

4. The device of claim 3, wherein the surface of the isolation material is recessed below an interface of the active semiconductor layer and an insulator layer of the SOI substrate.

5. The device of claim 1, wherein the surface of the isolation material is recessed by more than approximately 200 nm.

6. The device of claim 1, wherein the surface of the isolation material is recessed by more than approximately 300 nm.

7. The device of claim 1, wherein the surface of the isolation material is recessed by more than approximately 500 nm.

8. The device of claim 1, wherein the surface of the isolation material is recessed by more than approximately 300-1000 nm.

9. The device of claim 1 wherein the epitaxial layer further comprises a silicided epitaxial layer.

10. The device of claim 1 wherein the surface of the isolation material is recessed above an adjacent source/drain junction region.

11. The device of claim 1 further comprising a shallow trench isolation feature that includes the isolation material.

12. The device of claim 2, wherein the surface of the isolation material is recessed by more than approximately 200 nm.

13. The device of claim 2, wherein the surface of the isolation material is recessed by more than approximately 300 nm.

14. The device of claim 2 wherein the epitaxial layer further comprises a silicided epitaxial layer.

15. The device of claim 3 wherein the epitaxial layer further comprises a silicided epitaxial layer.

16. The device of claim 4 wherein the epitaxial layer further comprises a silicided epitaxial layer.

17. The device of claim 2 wherein the surface of the isolation material is recessed above an adjacent source/drain junction region.

18. The device of claim 3 wherein the surface of the isolation material is recessed above an adjacent source/drain junction region.

19. The device of claim 4 wherein the surface of the isolation material is recessed above an adjacent source/drain junction region.

20. The device of claim 9 wherein the surface of the isolation material is recessed above an adjacent source/drain junction region.

* * * * *